US010480066B2

United States Patent
Wu et al.

(10) Patent No.: US 10,480,066 B2
(45) Date of Patent: Nov. 19, 2019

(54) METAL DEPOSITION METHODS

(71) Applicant: Applied Materials, Inc., Santa Clara, CA (US)

(72) Inventors: Yong Wu, Sunnyvale, CA (US); Srinivas Gandikota, Santa Clara, CA (US); Abhijit Basu Mallick, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/123,437

(22) Filed: Sep. 6, 2018

(65) Prior Publication Data

US 2019/0271071 A1 Sep. 5, 2019

Related U.S. Application Data

(63) Continuation-in-part of application No. 15/961,363, filed on Apr. 24, 2018, which is a continuation-in-part of application No. 15/381,752, filed on Dec. 16, 2016, now Pat. No. 9,978,685.

(60) Provisional application No. 62/269,974, filed on Dec. 19, 2015, provisional application No. 62/569,883, filed on Oct. 9, 2017.

(51) Int. Cl.
*H01L 21/28* (2006.01)
*C23C 16/14* (2006.01)
*C23C 16/455* (2006.01)
*H01L 21/285* (2006.01)

(52) U.S. Cl.
CPC ........ *C23C 16/14* (2013.01); *C23C 16/45553* (2013.01); *H01L 21/28568* (2013.01)

(58) Field of Classification Search
CPC ... H01L 21/28; H01L 21/285; H01L 21/2856; H01L 21/28568
USPC .......................................... 257/773
See application file for complete search history.

(56) References Cited

U.S. PATENT DOCUMENTS

| | | |
|---|---|---|
| 5,227,329 A | 7/1993 | Kobayashi et al. |
| 5,726,094 A | 3/1998 | Schwalke et al. |
| 5,789,030 A | 8/1998 | Rolfson |
| 5,805,973 A | 9/1998 | Coffinberry et al. |
| 6,197,669 B1 | 3/2001 | Twu |
| 6,323,126 B1 | 11/2001 | Chittipeddi et al. |
| 6,352,755 B1 | 3/2002 | Finley et al. |
| 6,492,694 B2 | 12/2002 | Noble et al. |
| 6,642,092 B1 | 11/2003 | Voutsas et al. |
| 6,730,584 B2 | 5/2004 | Schuegraf et al. |
| 6,849,471 B2 | 2/2005 | Patel et al. |
| 7,208,354 B2 | 4/2007 | Bauer |

(Continued)

FOREIGN PATENT DOCUMENTS

| | | |
|---|---|---|
| JP | 2007297150 A | 11/2007 |
| KR | 20040040858 A | 5/2004 |

(Continued)

*Primary Examiner* — Monica D Harrison
(74) *Attorney, Agent, or Firm* — Servilla Whitney LLC

(57) ABSTRACT

A method of forming conformal amorphous metal films is disclosed. A method of forming crystalline metal films with a predetermined orientation is also disclosed. An amorphous nucleation layer is formed on a substrate surface. An amorphous metal layer is formed from the nucleation layer by atomic substitution. A crystalline metal layer is deposited on the amorphous metal layer by atomic layer deposition.

16 Claims, 1 Drawing Sheet

(56) References Cited

U.S. PATENT DOCUMENTS

| | | |
|---|---|---|
| 7,544,576 B2 | 6/2009 | Jawarani et al. |
| 7,630,114 B2 | 12/2009 | Wang et al. |
| 8,071,478 B2 * | 12/2011 | Wu .................... C23C 16/02 |
| | | 257/E21.476 |
| 8,697,533 B2 | 4/2014 | Herner |
| 8,766,260 B2 | 7/2014 | Kishida et al. |
| 8,883,603 B1 | 11/2014 | Maxwell |
| 9,793,139 B2 | 10/2017 | Sharangpani et al. |
| 2006/0128139 A1 | 6/2006 | Paranjpe et al. |
| 2007/0141812 A1 | 6/2007 | Zagwijn et al. |
| 2012/0012170 A1 | 1/2012 | Foss et al. |
| 2012/0309205 A1 | 12/2012 | Wang et al. |
| 2015/0263124 A1 | 9/2015 | Yamaguchi |
| 2017/0179036 A1 | 6/2017 | Chen et al. |

FOREIGN PATENT DOCUMENTS

| | | |
|---|---|---|
| WO | 0006795 A1 | 2/2000 |
| WO | 2007075369 A1 | 7/2007 |
| WO | 2009082517 A1 | 7/2009 |
| WO | 2017106660 A1 | 6/2017 |

* cited by examiner

METAL DEPOSITION METHODS

CROSS-REFERENCE TO RELATED APPLICATIONS

This application is a continuation-in-part application of U.S. application Ser. No. 15/961,363 filed Apr. 24, 2018, which claims priority to U.S. application Ser. No. 15/381,752, filed Dec. 16, 2016, now patented as U.S. Pat. No. 9,978,685, issued May 22, 2018, which claims priority to U.S. Provisional Application No. 62/269,974, filed Dec. 19, 2015; and U.S. Provisional Application No. 62/569,883, filed Oct. 9, 2017, all of which are incorporated by reference herein in their entirety.

TECHNICAL FIELD

Embodiments of the present disclosure generally relate to methods of depositing metal films. In particular, the disclosure relates to methods of providing metal films with varying crystallinity and orientation.

BACKGROUND

Amorphous metal deposition is a challenging process for the semiconductor industry. Deposition of conformal and amorphous metal films without peeling is particularly challenging process goal.

Further, it can be very difficult to control the crystallization orientation of metal films during processing and/or deposition. By controlling the crystallization orientation of deposited metal films it is possible to achieve films with lower resistivity and better morphology.

Accordingly, there is a need for methods of controlling the conformality, crystallinity and orientation of metal films.

SUMMARY

One or more embodiments of the disclosure are directed to a method of forming an amorphous metal layer. The method comprises exposing a substrate surface of a substrate material to a nucleation precursor to form an amorphous nucleation layer. The amorphous nucleation layer is exposed to a metal precursor to form an amorphous metal layer.

Additional embodiments of the disclosure are directed to a method of forming a 110-oriented tungsten film. The method comprises exposing a surface of an amorphous substrate material to a nucleation precursor to form an amorphous nucleation layer. The amorphous nucleation layer is exposed to a first tungsten precursor to form an amorphous tungsten layer. The amorphous tungsten layer is separately exposed to a second tungsten precursor and a reactant.

Further embodiments of the disclosure are directed to a method of forming a randomly oriented tungsten film. The method comprises exposing a surface of a crystalline substrate material to a nucleation precursor to form an amorphous nucleation layer. The amorphous nucleation layer is exposed to a first tungsten precursor to form an amorphous tungsten layer. The amorphous tungsten layer is separately exposed to a second tungsten precursor and a reactant.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1A:
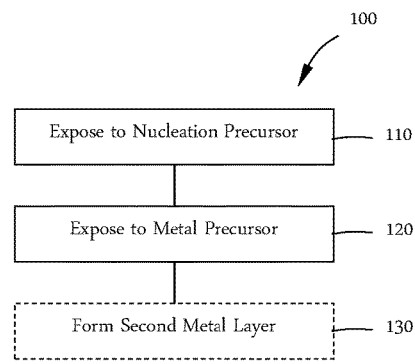
FIG. 1A shows a process scheme in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate or portion of the substrate is exposed sequentially to the two or more reactive compounds which are introduced into a reaction zone of a processing chamber. In a time-domain ALD process, exposure to each reactive compound is separated by a time delay to allow each compound to adhere and/or react on the substrate surface. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness.

In an aspect of a spatial ALD process, a first reactive gas and second reactive gas (e.g., hydrogen radicals) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Embodiments of the present disclosure relate to methods for depositing metal films. Some methods of the disclosure relate to methods for advantageously depositing or forming amorphous metal films. Some methods of the disclosure relate to methods for advantageously depositing or forming crystalline metal films with a predetermined orientation (e.g. 110-oriented W films). Some methods of the disclosure relate to methods for advantageously depositing or forming crystalline metal films with a random orientation.

One or more embodiments of the disclosure are directed to methods of depositing a metal layers and films. While tungsten deposition is referred to in many embodiments, those skilled in the art will understand that other metals (e.g., Mo) can also be deposited by the disclosed processes.

Figure 1B:
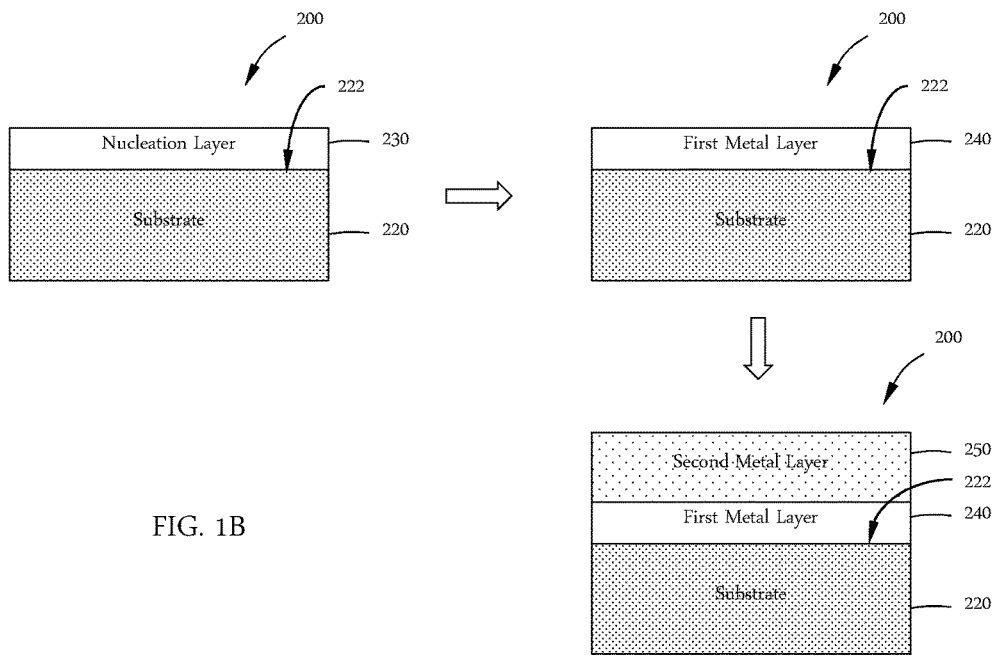
FIG. 1B shows a schematic of a film stack in accordance with the process scheme of FIG. 1A.

With reference to FIGS. 1A and 1B, one or more embodiments of the disclosure are directed processing methods 100 for forming film stacks 200. At 110, a substrate material 220 having a substrate surface 222 is exposed to a nucleation precursor to form an amorphous nucleation layer 230. In some embodiments, the nucleation layer 230 is formed by thermal decomposition of the nucleation precursor. In some embodiments, the nucleation layer is substantially amorphous. As used in this regard, the term "substantially amorphous" means that there is less than or equal to about 10%, less than or equal to about 5%, less than or equal to about 2%, less than or equal to about 1%, or less than or equal to about 0.5% crystallization of the layer by volume.

In some embodiments, the substrate material 220 comprises a metal material. In some embodiments, the substrate material 220 comprises a dielectric material. In some embodiments, the substrate material 220 comprises one or more of silicon dioxide, aluminum oxide, or titanium nitride. In some embodiments, the substrate material 220 consists essentially of aluminum oxide or titanium nitride. As used in this regard, "consists essentially of" means that the substrate material comprises greater than 95%, 98%, 99% or 99.5% of the stated material on an atomic basis. A skilled artisan will recognize that terms like "aluminum oxide" and "titanium nitride" do not convey any specific atomic ratio of elements. These materials may be either stoichiometric or non-stoichiometric.

In some embodiments, the nucleation precursor comprises a silicon precursor and the nucleation layer is a silicon-containing layer. In some embodiments, the nucleation precursor consists essentially of a silicon precursor. In some embodiments, the silicon-containing layer is an amorphous silicon (a-Si) layer.

Suitable silicon precursors include, but are not limited to, silanes polysilanes and halosilanes. In some embodiments, the silicon precursor comprises one or more species with a general formula of $Si_aH_bX_c$, where each X is a halogen independently selected from F, Cl, Br and I, a is any integer greater than or equal to 1, b and c are each less than or equal to 2a+2 and b+c is equal to 2a+2.

In some embodiments, the nucleation precursor comprises a boron precursor and the nucleation layer is a boron-containing layer. In some embodiments, the nucleation precursor consists essentially of a boron precursor. In some embodiments, the boron-containing layer is an amorphous boron layer.

Suitable boron precursors include, but are not limited to, boranes, alkylboranes and haloboranes. In some embodiments, the boron precursor comprises one or more species with a general formula of $B_dH_eX_gR_h$, where each X is a halogen independently selected from F, Cl, Br and I, each R is an independently selected C1-C4 alkyl group, a is any integer greater than or equal to 1, each of e, f and g is less than or equal to d+2 and e+f+g is equal to d+2.

In some embodiments, the nucleation precursor comprises a silicon precursor and a boron precursor and the nucleation layer is an amorphous layer comprising silicon and boron. In some embodiments, the nucleation layer comprises a silicon doped boron layer. In some embodiments, the amorphous layer comprises a boron doped silicon layer. As used in this regard, a layer of a first element doped with a second element has an atomic percentage of the second element greater than or equal to about 5 atomic percent but less than or equal to about 30 atomic percent.

The thickness of the nucleation layer 230 can vary depending on, for example, the substrate surface 222 and subsequent films and processes. In some embodiments, the nucleation layer 230 has a thickness greater than or equal to about 20 Å. In one or more embodiments, the nucleation layer 230 has a thickness in the range of about 1 Å to about 200 Å, or in the range of about 10 Å to about 150 Å, or in the range of about 20 Å to about 100 Å, or in the range of about 40 Å to about 100 Å. In some embodiments, the nucleation layer 230 has a thickness in the range of about 10 Å to about 50 Å. In some embodiments, the thickness of the nucleation layer 230 is greater than 0 Å and less than or equal to about 100 Å, 75 Å, 50 Å, 45 Å or 40 Å.

In some embodiments, the nucleation layer 230 has a minimum thickness sufficient to form a continuous layer. As used herein, the term "continuous" refers to a layer that covers an entire exposed surface without gaps or bare spots that reveal the substrate surface 222 underlying the nucleation layer 230. A continuous layer may have gaps or bare spots with a surface area less than about 1% of the total surface area of the film.

In some embodiments, the nucleation layer 230 forms conformally on the substrate surface 222. As used herein, the term "conformal", or "conformally", refers to a layer that adheres to and uniformly covers exposed surfaces with a thickness having a variation of less than 1% relative to the average thickness of the film. For example, a 100 Å thick film would have less than 1 Å variations in thickness. This thickness and variation includes edges, corners, sides, and the bottom of recesses. For example, a conformal layer deposited in various embodiments of the disclosure would provide coverage over the deposited region of substantially uniform thickness on complex surfaces.

At 120 the nucleation layer 230 is exposed to a first metal precursor to form a first metal layer 240. The first metal precursor comprises a first metal. In some embodiments, forming a first metal layer is performed by converting the nucleation layer 230 to a first metal layer 240. In some embodiments, the conversion process involves substituting atoms of the nucleation layer 230 with first metal atoms. In some embodiments, $H_2$ is added to as a co-reactant with the first metal precursor.

The first metal may be any suitable metal. In some embodiments, the first metal comprises tungsten or molybdenum. In some embodiments, the first metal precursor comprises one or more ligand selected from halides, carbonyls or cyclopentadienes. In some embodiments, the first metal precursor comprises or consists essentially of one or more of $WF_6$, $WCl_6$, $WCl_5$, $W(CO)_5$, $MoF_6$, $MoCl_5$, or $Mo(CO)_6$. As used in this regard, "consists essentially of" means that the first metal precursor comprises greater than 95%, 98%, 99% or 99.5% of the stated species.

In some embodiments, the first metal precursor comprises substantially no fluorine. As used in this regard, "comprises substantially no fluorine" means that the first metal precursor comprises less than 2%, 1%, 0.5% or 0.1% fluorine atoms on an atomic basis.

The nucleation layer 230 is amorphous. In some embodiments, the first metal layer 240 is also substantially amorphous. In some embodiments, the method 100 ends after operation 120 and forms an amorphous first metal layer.

Some embodiments of this disclosure are described with respect to a first metal, first metal precursor or first metal layer. Some embodiments may additionally refer to a second metal, second metal precursor or second metal layer. A skilled artisan will recognize that when only one precursor is used within a disclosed process, it may be referred to simply as a metal, metal precursor, or metal layer without the ordinal number attached.

The methods of the disclosure may continue with an optional deposition process at 130. At 130, a second metal layer 250 is formed on the first metal layer 240 by exposing the first metal layer 240 to a second metal precursor. The second metal precursor comprises a second metal. A second metal precursor comprising tungsten may be referred to as a second tungsten precursor. The second metal may be any suitable metal. In some embodiments, the second metal comprises tungsten or molybdenum. In some embodiments, the second metal layer 250 consists essentially of tungsten. In some embodiments, the second metal layer 250 consists essentially of molybdenum. As used in this regard, "consists essentially of" means that the second metal layer 250 comprises greater than 95%, 98%, 99% or 99.5% of the specified element on an atomic basis. In some embodiments, the first metal precursor and second metal precursor comprise the same metal. In some embodiments, the first metal precursor and second metal precursor comprise different metals.

In some embodiments, the second metal precursor comprises one or more ligand selected from halides, carbonyls or cyclopentadienes. In some embodiments, the second metal precursor comprises or consists essentially of one or more of $WF_6$, $WCl_6$, $WCl_5$, $W(CO)_5$, $MoF_6$, $MoCl_5$, or $Mo(CO)_6$. As used in this regard, "consists essentially of" means that the first metal precursor comprises greater than 95%, 98%, 99% or 99.5% of the stated species.

The second metal layer 250 can be formed by any suitable technique including, but not limited to, atomic layer deposition (ALD), plasma-enhanced atomic layer deposition (PE-ALD), chemical vapor deposition (CVD), plasma-enhanced chemical vapor deposition (PE-CVD) and physical vapor deposition (PVD).

In some embodiments, the second metal layer 250 is deposited by ALD. In some embodiments, the second metal layer 250 is formed by separately exposing the first metal film 240 to a second tungsten precursor and a reactant.

The reactant can be any suitable reactant that is able to react with a species formed on the surface. For example, in an ALD process, if $WF_6$ is used as the precursor, there will be —$WF_x$ species on the surface. The reactant is able to react with the —$WF_x$ species to produce a W film. In some embodiments, the reactant comprises hydrogen gas ($H_2$), nitrogen gas ($N_2$), or a nucleation promoter such as silanes (including polysilanes and halosilanes), or boranes (including haloboranes and alkyl boranes).

In some embodiments, the second metal layer is substantially crystalline. As used in this regard, the term "substantially crystalline" means that there is less than or equal to about 10%, less than or equal to about 5%, less than or equal to about 2%, less than or equal to about 1%, or less than or equal to about 0.5% amorphous regions of the layer by volume.

In some embodiments, the substrate material 220 is selected to provide for a predetermined orientation of the second metal layer 250. In some embodiments, the substrate material 220 comprises an amorphous or substantially amorphous substrate material. In some embodiments, the substrate material 220 comprises or consists essentially of aluminum oxide. In some embodiments, when the substrate material 220 is amorphous, the second metal layer 250 has a 110 orientation.

In some embodiments, the substrate material 220 comprises a crystalline or substantially crystalline substrate material. In some embodiments, the substrate material 220 comprises or consists essentially of titanium nitride. In some embodiments, when the substrate material 220 is crystalline, the second metal layer 250 has a random orientation. As used in this regard, a random orientation does not refer to a single orientation chosen at random from available orientations, but rather that the second metal layer 250 comprises all of the available orientations organized randomly.

In some embodiments, an inert gas may be added to the processing chamber during processing. In some embodiments, an inert gas is added during formation of the first metal film 240. In some embodiments, an inert gas is added during formation of the second metal film 250. Inert gases may be flowed into the processing chamber with the first or second metal precursor or may be flowed separately. In some embodiments, an inert gas comprises one or more of Ar, He, or nitrogen gas ($N_2$).

The temperature at which the substrate surface is exposed to the nucleation precursor, first metal precursor and/or second metal precursor can be varied depending on, for example, the thermal budget of the device being formed and the precursors selected. In some embodiments, exposure to each of the precursors occurs at a temperature in the range of about 25° C. to about 700° C. In one or more embodiments, the substrate surface 220 is exposed to the nucleation precursor and/or the first metal precursor at a temperature in the range of about 25° C. to about 700° C., or in the range of about 50° C. to about 600° C., or in the range of about 100° C. to about 500° C. In some embodiments, the first metal layer 240 is separately exposed to the second metal precursor and the reactant at a temperature in a range of about 200° C. to about 550° C., in a range of about 300° C. to about 500° C., or in a range of about 400° C. to about 450° C.

In some embodiments, the substrate is exposed to the nucleation precursor, the first metal precursor, the second metal precursor and/or the reactant at a temperature greater than or equal to about 25° C. and less than or equal to about 550° C., less than or equal to about 400° C., less than or equal to about 250° C., less than or equal to about 200° C., or less than or equal to about 100° C. In some embodiments, the nucleation layer 230 and the first metal film 240 are formed at a temperature in a range of about 300° C. to about 550° C., while the second metal film is formed at a temperature in a range of about 200° C. to about 550° C.

The pressure at which the substrate is exposed to the nucleation precursor, first metal precursor and/or second metal precursor can be varied depending on, for example, the precursors selected and other process conditions. In some embodiments, exposure to each of the precursors occurs at a pressure in the range of about 0.01 Torr to about 100 Torr. In one or more embodiments, the substrate is exposed at a pressure in the range of about 0.01 Torr to about 100 Torr, or in the range of about 0.1 Torr to about 80 Torr, or in the range of about 1 Torr to about 60 Torr. In some embodiments, the substrate is exposed at a pressure greater than or equal to about 1 Torr and less than or equal to about 100 Torr, less than or equal to about 80 Torr, less than or equal to about 60 Torr, less than or equal to about 40 Torr, or less than or equal to about 25 Torr. In some embodiments, the substrate is exposed at a pressure in a range of about 4 Torr to about 100 Torr.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming an amorphous metal layer, the method comprising:
exposing a substrate surface of a substrate material to a nucleation precursor to form a conformal amorphous nucleation layer, the nucleation precursor comprising a silicon precursor with a general formula of $Si_aH_bX_c$, where each X is a halogen independently selected from F, Cl, Br and I, a is any integer greater than or equal to 1, b and c are each less than or equal to 2a+2 and b+c is equal to 2a+2; and
converting the conformal amorphous nucleation layer to a conformal amorphous metal layer by substituting atoms of the conformal amorphous nucleation layer with metal atoms from a metal precursor.

2. The method of claim 1, wherein the substrate material consists essentially of a metal material.

3. The method of claim 1, wherein the substrate material comprises a dielectric material.

4. The method of claim 3, wherein the substrate material comprises aluminum oxide or titanium nitride.

5. The method of claim 1, wherein the nucleation precursor further comprises a boron precursor.

6. The method of claim 5, wherein the nucleation precursor comprises one or more species with a general formula of $B_dH_eX_fR_g$, where each X is a halogen independently selected from F, Cl, Br and I, each R is an independently selected C1-C4 alkyl group, d is any integer greater than or equal to 1, each of e, f and g is less than or equal to d+2 and e+f+g is equal to d+2.

7. The method of claim 1, wherein the metal precursor comprises tungsten and the conformal amorphous metal layer comprises tungsten.

8. The method of claim 7, wherein the metal precursor comprises one or more of $WF_6$, $WCl_6$, $WCl_5$, and $W(CO)_5$.

9. A method of forming an amorphous metal layer, the method comprising:
exposing a substrate surface of a substrate material to a nucleation precursor to form a conformal amorphous nucleation layer, the nucleation precursor comprising a boron precursor with a general formula of $B_dH_eX_fR_g$, where each X is a halogen independently selected from F, Cl, Br and I, each R is an independently selected C1-C4 alkyl group, d is any integer greater than or equal to 1, each of e, f and g is less than or equal to d+2 and e+f+g is equal to d+2; and
converting the conformal amorphous nucleation layer to a conformal amorphous metal layer by substituting atoms of the conformal amorphous nucleation layer with metal atoms from a metal precursor.

10. The method of claim 9, wherein the substrate material consists essentially of a metal material.

11. The method of claim 9, wherein the substrate material comprises a dielectric material.

12. The method of claim 11, wherein the substrate material comprises aluminum oxide or titanium nitride.

13. The method of claim 9, wherein the nucleation precursor further comprises a silicon precursor.

14. The method of claim 13, wherein the nucleation precursor comprises one or more species with a general formula of $Si_aH_bX_c$, where each X is a halogen independently selected from F, Cl, Br and I, a is any integer greater than or equal to 1, b and c are each less than or equal to 2a+2 and b+c is equal to 2a+2.

15. The method of claim 9, wherein the metal precursor comprises tungsten and the conformal amorphous metal layer comprises tungsten.

16. The method of claim 15, wherein the metal precursor comprises one or more of $WF_6$, $WCl_6$, $WCl_5$, and $W(CO)_5$.

* * * * *